(12) United States Patent
Kim et al.

(10) Patent No.: US 6,794,241 B2
(45) Date of Patent: Sep. 21, 2004

(54) METHOD FOR FABRICATING CAPACITOR IN SEMICONDUCTOR DEVICE

(75) Inventors: Kyong-Min Kim, Ichon-shi (KR);
Hoon-Jung Oh, Ichon-shi (KR);
Jong-Bum Park, Ichon-shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 10/320,501

(22) Filed: Dec. 17, 2002

(65) Prior Publication Data

US 2003/0235999 A1 Dec. 25, 2003

(30) Foreign Application Priority Data

Jun. 22, 2002 (KR) .............................. 10-2002-0035155

(51) Int. Cl.⁷ ........................................ H01L 21/8242
(52) U.S. Cl. ....................... 438/240; 438/253; 438/724
(58) Field of Search ............................ 438/3, 238–240, 438/253–256, 381, 724, 393–399

(56) References Cited

U.S. PATENT DOCUMENTS 6,365,486 B1     4/2002  Agarwal et al.
6,410,400 B1 *   6/2002  Lee et al. ................... 438/396
6,544,900 B2 *   4/2003  Raaijmakers et al. ....... 438/680

\* cited by examiner

*Primary Examiner*—H. Jey Tsai
(74) *Attorney, Agent, or Firm*—Jacobson Holman PLLC

(57) ABSTRACT

The present invention relates to a method for fabricating a capacitor in a semiconductor device capable of preventing a decrease in capacitance and improving a leakage current characteristic. The inventive method includes the steps of: forming a lower electrode on a substrate; cleaning the lower electrode with use of HF and $NH_4OH$; nitrifying the lower electrode through a $NH_3$ annealing; depositing a nitride layer on the nitrified lower electrode; and forming sequentially a dielectric material and an upper electrode on the nitride layer.

7 Claims, 7 Drawing Sheets

HF CLEANING

RTN or NH₃ PLASMA TREATMENT

METHOD FOR FABRICATING CAPACITOR IN SEMICONDUCTOR DEVICE

FIELD OF THE INVENTION

The present invention relates to a method for fabricating a capacitor in a semiconductor device; and, more particularly, to a method for fabricating a capacitor with use of a $Ta_2O_5$ dielectric material so as to improve capacitance and leakage current characteristics.

DESCRIPTION OF RELATED ARTS

As known, a capacitor having a structure wherein a dielectric material is put in between a lower electrode and an upper electrode functions as a memory site for storing a predetermined number of data in a memory device such as a DRAM.

Capacitance of the capacitor is directly proportional to a surface area of an electrode and a dielectric constant of a dielectric material. Hence, it is evidently necessary to use a dielectric material having a high dielectric constant or increase a surface area through a hemi spherical grain technique or decrease a distance between electrodes to obtain a capacitor with a high capacitance.

Hereinafter, a typical method for fabricating a capacitor will be described with reference to FIGS. 1 to 4.

First of all, as shown in FIG. 1, a polysilicon 11 for the use in a lower electrode of a capacitor is formed on a substrate 10 previously constructed with prepared device elements such as a transistor. Then, a native oxide layer formed at the polysilicon lower electrode 11 is removed by performing a HF cleaning process. FIG. 1 illustrates this process of the removal.

After removing the native oxide layer, a surface of the polysilicon lower electrode 11 is nitridated through a rapid thermal process or an ammonia ($NH_3$) plasma process in an atmosphere of nitrogen. The reason for the nitridation is to impede oxygen, released from a high thermal process proceeded in an atmosphere of oxygen after forming a dielectric material, from penetrating into the dielectric material and oxidizing the polysilicon lower electrode 11.

Referring to FIG. 3, a $Ta_2O_5$ dielectric material 12 is deposited on the polysilicon lower electrode 11. The $Ta_2O_5$ dielectric material 12 is deposited on a wafer, specifically heated at an appropriate temperature by setting a source gas, e.g., $Ta(OC_2H_5)_5$ and a reactant gas, e.g., $O_2$ to react within a reaction chamber.

The deposition of the $Ta_2O_5$ dielectric material is followed by the high thermal process in order to induce crystallization of the $Ta_2O_5$ dielectric material 12, depletion of carbon and supplement of oxygen within the dielectric material. The high thermal process is performed at a temperature in a range from about 650° C. to about 800° C. in an atmosphere of either $N_2O$ or $O_2$ for a prolonged period.

As illustrated in FIG. 4, an upper electrode 13 formed with TiN and polysilicon is deposited on the $Ta_2O_5$ dielectric material. Through the steps as described above, the capacitor fabrication is completed.

However, the capacitor, fabricated in accordance with the typical method, has a disadvantage that oxygen penetrates into the $Ta_2O_5$ dielectric material and oxidizes the lower electrode constructed with polysilicon when carrying out the high thermal process proceeded after fabricating the dielectric material.

Therefore, a rapid thermal process or an ammonia plasma process is performed in an atmosphere of nitrogen after forming the polysilicon lower electrode 11 in order to prevent the oxidization of the polysilicon. However, in case of employing the ammonia plasma process, there is a problem of a poor step coverage, resulting in an incomplete nitridation over a whole surface of a memory cell, thereby, eventually failing to prevent the oxidization of the polysilicon lower electrode 11.

The oxidized lower electrode along with the $Ta_2O_5$ dielectric material enacts as a double dielectric material, which is a factor that reduces capacitance of a device and provokes a leakage current characteristic.

SUMMARY OF THE INVENTION

It is, therefore, an object of the present invention to provide a method for fabricating a capacitor in a semiconductor device that is able to improve capacitance and leakage current characteristics.

In accordance with an aspect of the present invention, there is provided a method for fabricating a capacitor in a semiconductor device, including the steps of: forming a lower electrode on a substrate; cleaning the lower electrode with use of HF and $NH_4OH$; nitrifying the lower electrode through a $NH_3$ annealing; depositing a nitride layer on the nitrified lower electrode; and forming sequentially a dielectric material and an upper electrode on the nitride layer.

In accordance with another aspect of the present invention, the novel method for fabricating a capacitor particularly with use of a $Ta_2O_5$ dielectric material includes two separate steps of a nitridation process. After forming a polysilicon lower electrode, the nitridation process is first instigated with a $NH_3$ annealing process performed in a furnace and then subsequently with a deposition of a nitride layer. The two separate steps strongly prevent the lower electrode from being oxidized so as to improve a leakage current characteristic and prevent the reduction of capacitance. Also, instead of employing solely a HF cleaning process after forming of the lower electrode, both HF and $NH_4OH$ are used for the cleaning process to reinforce the improvement of the characteristic in leakage current.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE INVENTION

Figure 1:
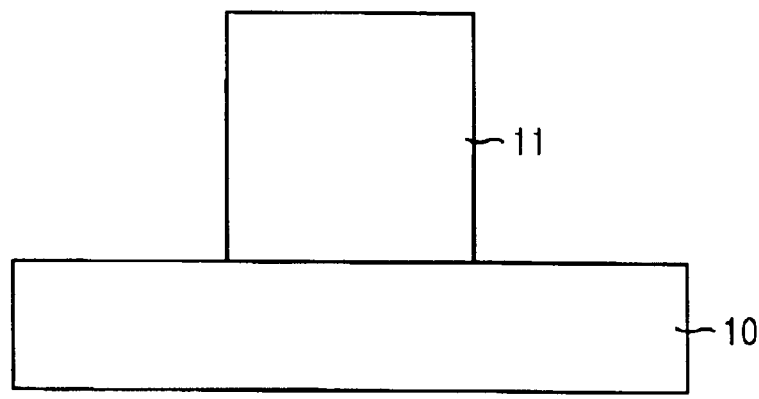
FIGS. 1 to 4 are cross-sectional views illustrating a typical method for fabricating a capacitor in accordance with the prior art.
Figure 2:
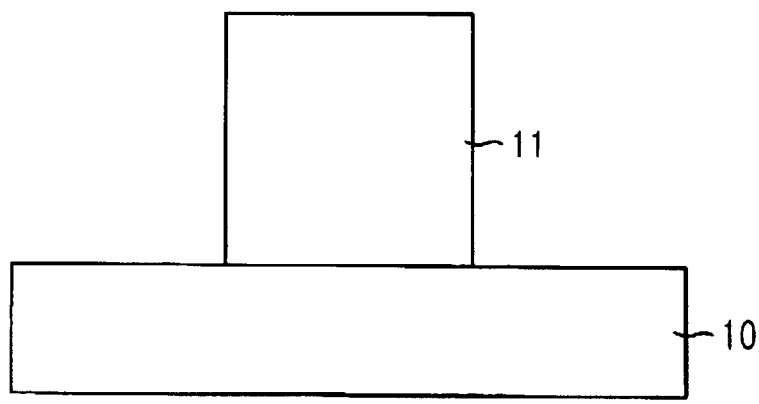
Figure 3:
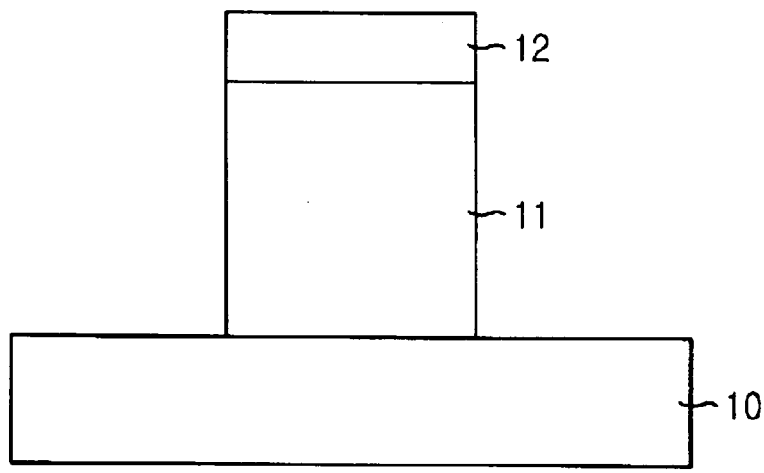
Figure 4:
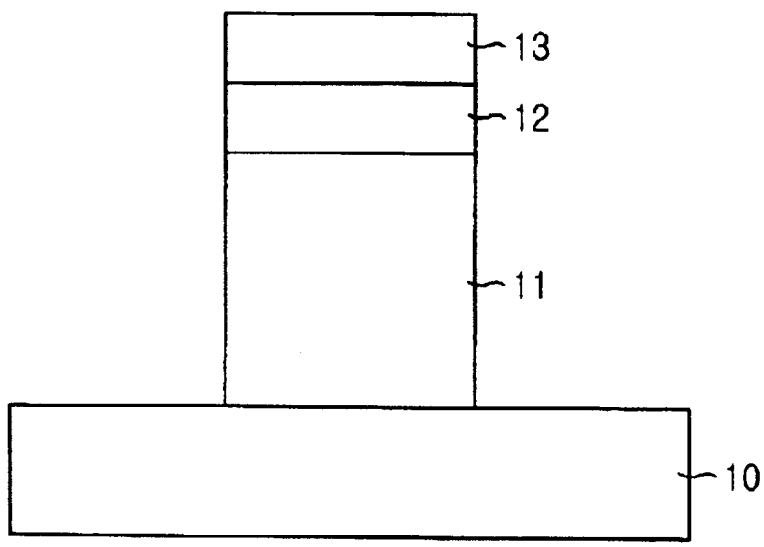
Figure 5:
FIGS. 5 to 9 are cross-sectional views illustrating a method for fabricating a capacitor in accordance with a preferred embodiment of the present invention.
Figure 5:
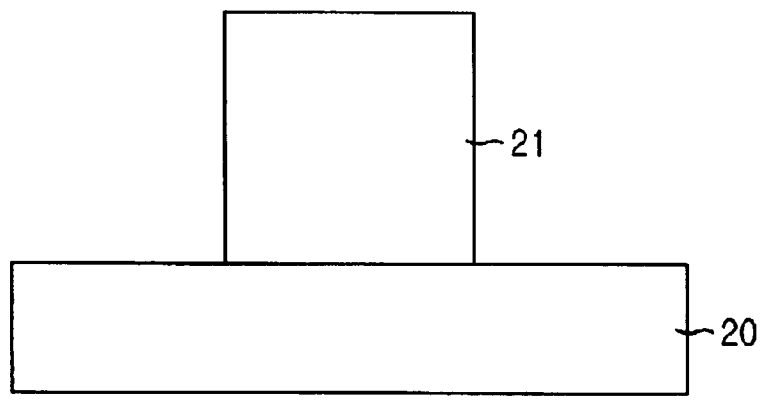

FIGS. 5 to 9 are cross-sectional views illustrating a method for fabricating a capacitor in a semiconductor device in accordance with a preferred embodiment of the present invention. Referring to FIG. 5, a polysilicon 21 to be used in a lower electrode of a capacitor is formed on a substrate 20 previously constructed with a series of prepared device elements such as a transistor and so on. Although polysilicon is used for the lower electrode in this preferred embodiment, it is still possible to use a metal to form the lower electrode.

Referring to FIG. 5, a cleaning process that uses both HF and $NH_4OH$ is then performed to remove a native oxide layer formed on the polysilicon lower electrode 21. Compared to the cleaning process using merely HF, the cleaning process using both HF and $NH_4OH$ provides an advantage in improving a leakage current characteristic due to a chemical oxide layer remained on the lower electrode.

After removing the native oxide layer, a nitridation process is proceeded on a surface of the polysilicon lower electrode 21 in order to prevent oxidization of the polysilicon lower electrode 21 resulted from oxygen penetrated into a dielectric material while carrying out a high thermal process in an atmosphere of oxygen after forming the dielectric material.

The preferred embodiment of the present invention is different from the typical method in an aspect of the nitridation procedure by having two separate steps for nitridating the polysilicon lower electrode 21. More detailed descriptions with respect to the nitridation process will be provided in the following.

Figure 6:
Figure 6:
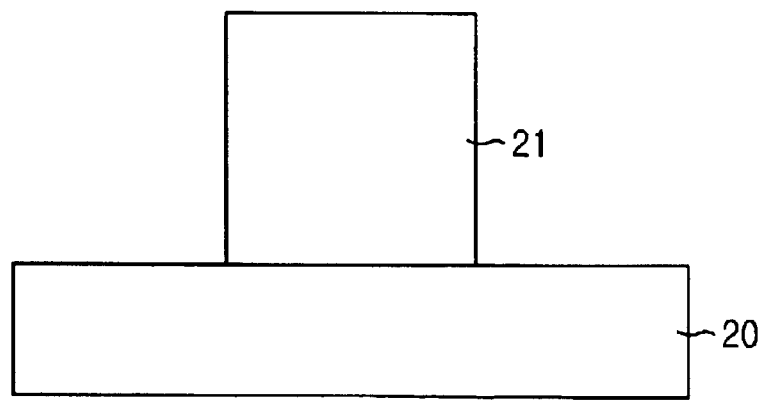

First, as shown in FIG. 6, an $NH_3$ annealing process is performed at a furnace with use of $NH_3$ gas.

The $NH_3$ annealing performed at the furnace provides a better step coverage than a typical $NH_3$ plasma process, and this enhanced step coverage acquires an improved nitridation over a whole surface of a memory cell in accompanying to a current trend in progressive micronization of cell size. This improved nitridation, consequently, enacts as a barrier for preventing the polysilicon lower electrode 21 from being oxidized during the subsequent high thermal process in the atmosphere of oxygen.

The NH3 annealing process in accordance with the preferred embodiment of the present invention is operated at the furnace setup with a temperature in a range from about 500° C. to about 800° C. and a pressure in a range from about 1 Torr to about 200 Torr for about 1 to 3 hours, and an amount of the $NH_3$ gas is arranged in a range from 1 slm to about 20 slm.

Figure 7:
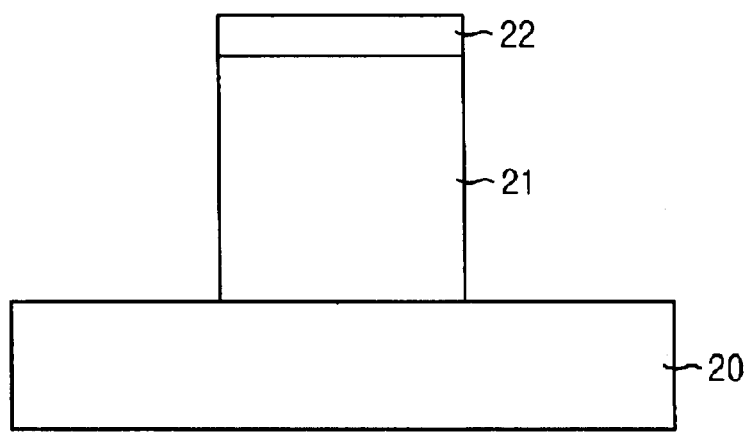

With reference to FIG. 7, after the NH3 annealing process, a nitride layer 22 is now deposited on the nitridated polysilicon lower electrode 21. The reason for this deposition of the nitride layer 22 is to reinforce the prevention of the oxidization in the polysilicon lower electrode 21.

The deposition of the nitride layer 22 also occurs at the furnace setup with a temperature in a range from about 500° C. to about 800° C. and a pressure in a range from about 0.1 Torr to about 1.0 Torr for about 3 to 10 minutes. At this time, a $NH_3$ gas and a di-chloro-silen gas ($SiH_2Cl_2$, hereinafter is used for depositing the nitride layer 22. The ratio of $NH_3$ gas:di-chloro-silen gas is 3~10:1.

Figure 8:
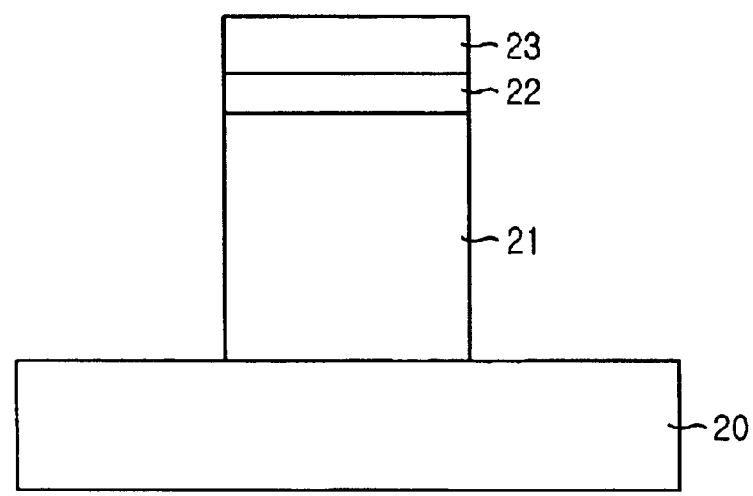

Next, referring to FIG. 8, a $Ta_2O_5$ dielectric material 23 is deposited over the nitride layer 22. The $Ta_2O_5$ dielectric material 23 is formed with use of $Ta(OC_2H_5)_5$ and $O_2$ as a source gas and a reactant gas, respectively. Particularly, the $Ta(OC_2H_5)_5$ is induced to be in a gas state at a vaporizer maintained with a temperature in a range from about 170° C. to about 190° C., and the reactant gas $O_2$ ranging from about 10 sccm to about 1000 sccm is used. Also, the pressure within the reaction chamber is set to be in a range from about 0.1 Torr to 2.0 Torr. With this set of conditions, the $Ta_2O_5$ dielectric material 23 is deposited on a wafer heated with a temperature in a range from about 300° C. to about 400° C.

Then, crystallization of the $Ta_2O_5$ dielectric material 23 is induced and a high thermal process is performed in an atmosphere of oxygen to reduce depletion of oxygen or to reduce carbon within the dielectric material. Especially, the high thermal process is performed at a temperature in a range from about 650° C. to 800° C. in an atmosphere of $N_2O$ or $O_2$ for about 5 to 30 minutes.

Figure 9:
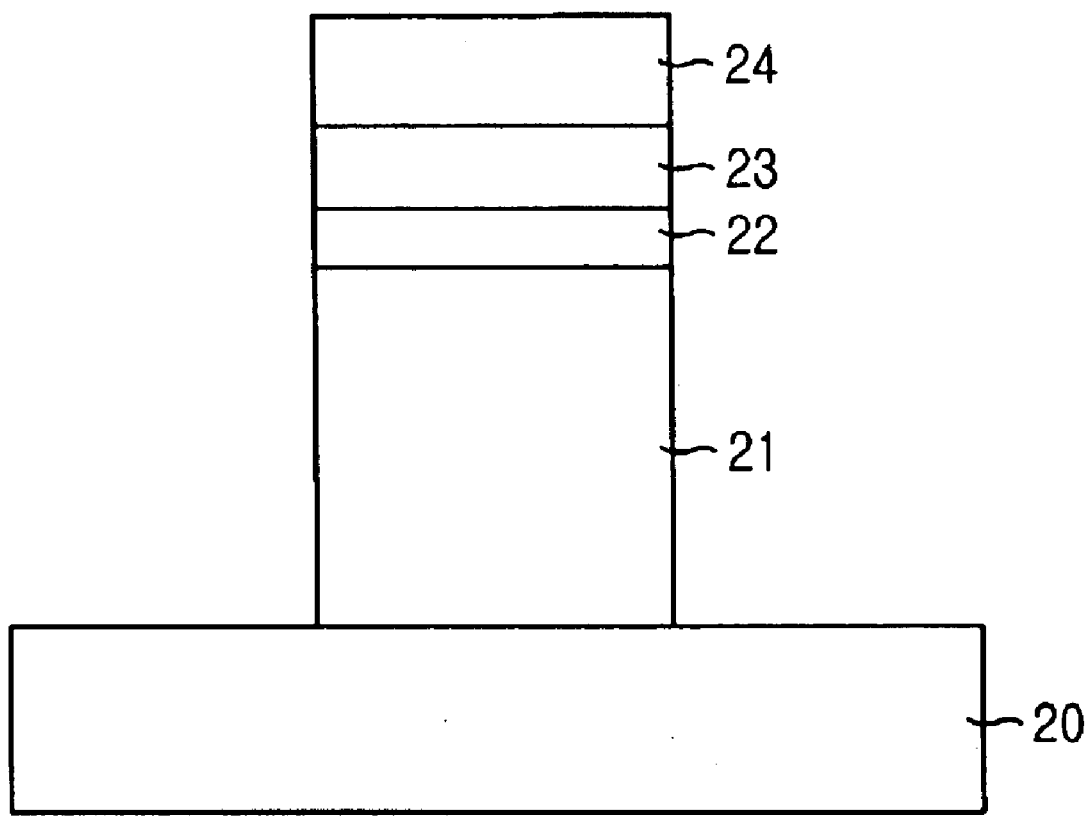

With reference to FIG. 9, an upper electrode 24 constructed with TiN and polysilicon is deposited on the $Ta_2O_5$ dielectric material 23. Through the above described steps, the capacitor fabrication is completed.

Figure 10:
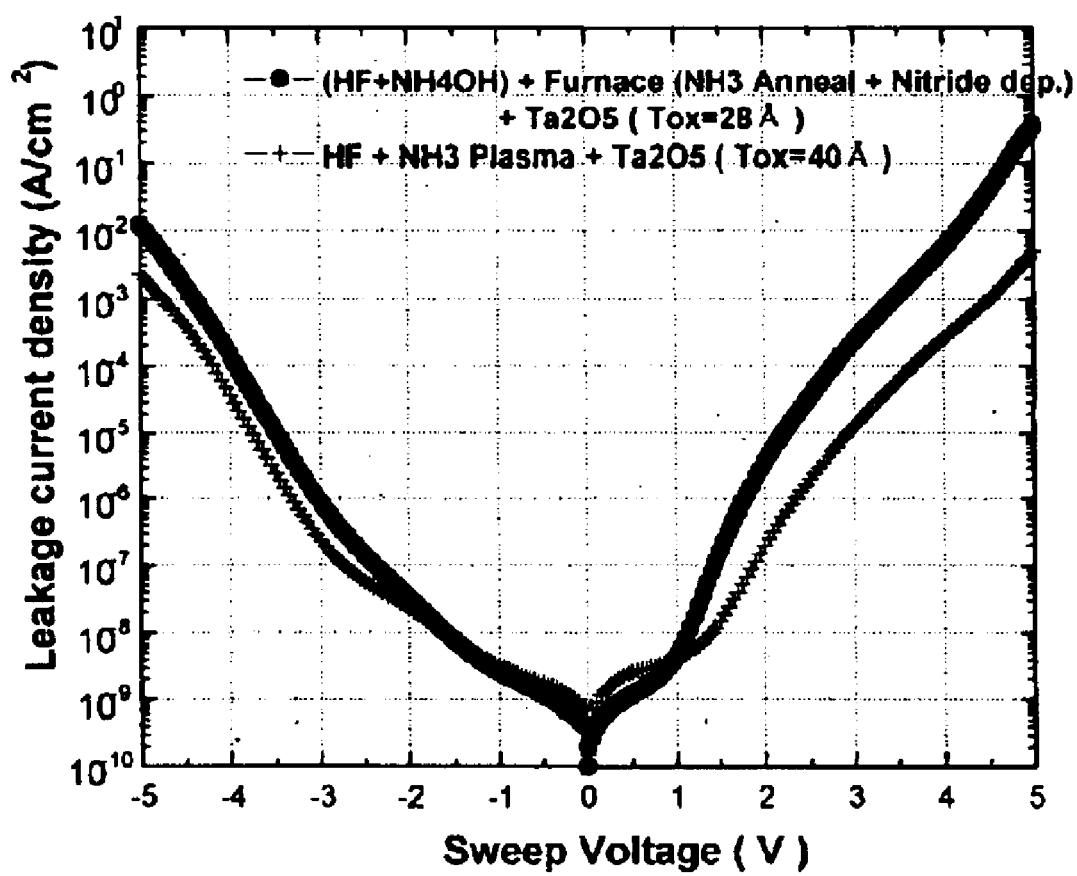
FIGS. 10 to 11 are graphs illustrating comparative values in leakage current characteristics of two capacitors, each being fabricated in accordance with the preferred embodiment and the prior art.
Figure 11:
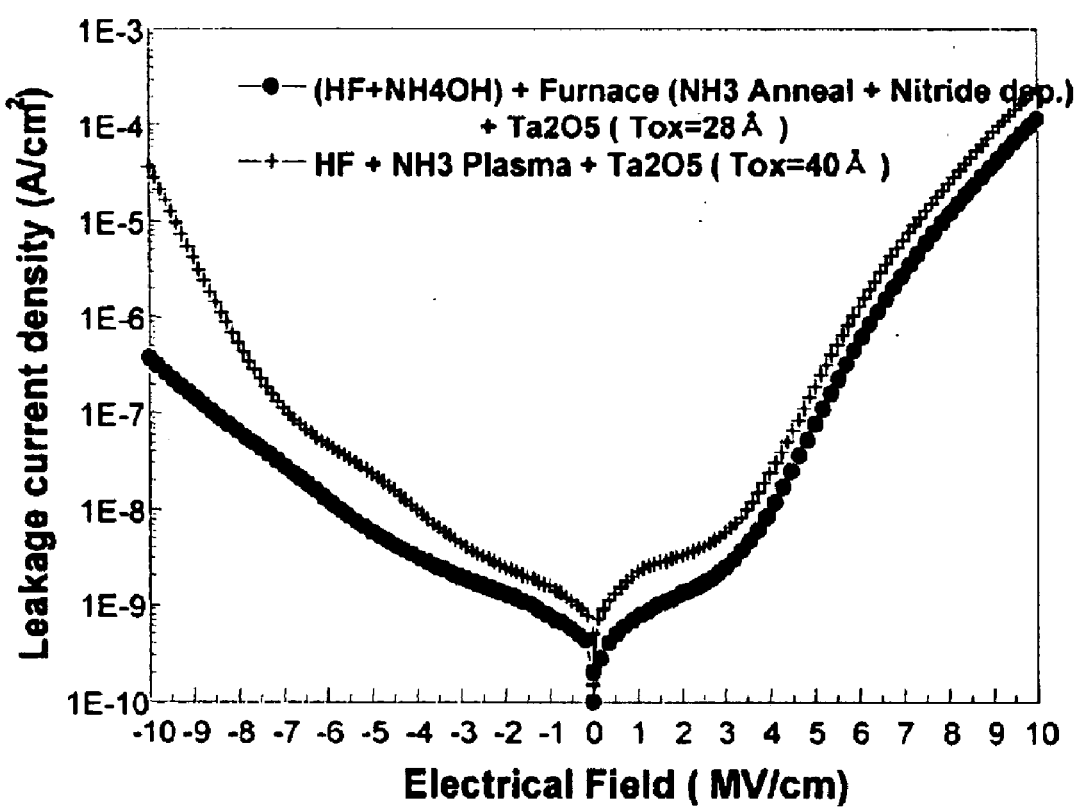

FIGS. 10 to 11 are graphs illustrating a leakage current characteristic with respect to a voltage in two capacitors, each being fabricated in accordance with the preferred embodiment of the present invention and the typical method provided by the prior art. First, referring to FIG. 10, in case of employing the typical prior art wherein it uses a HF cleaning and a $NH_3$ plasma process, the leakage current characteristic seems relatively adequate compared to the preferred embodiment of the present invention. However, in case of accounting for a thickness of an identical effective oxide layer ($T_{ox}$) in each capacitor, it becomes evident that the capacitor fabricated in accordance with the preferred embodiment of the present invention shows an adequate leakage current characteristic.

When the inventive method is applied to fabricate a capacitor, it is possible to promote a decrease in capacitance of the capacitor that occurs due to the oxidation of the lower electrode, thereby operating a device with a good confidence level. Also, the characteristic of leakage current is improved, resulting in an effect on the reduction of power consumption.

While the present invention has been described with respect to certain preferred embodiments, it will be apparent to those skilled in the art that various changes and modifications may be made without departing from the scope of the invention as defined in the following claims.

What is claimed is:

1. A method for fabricating a capacitor in a semiconductor device, comprising the steps of:

forming a lower electrode on a substrate;

cleaning the lower electrode with use of HF and $NH_4OH$;

nitrifying the lower electrode through a $NH_3$ annealing process;

depositing a nitride layer on the nitridated lower electrode, wherein the deposition of the nitride layer is proceeded in the furnace at a temperature ranging from about 500° C. to about 800° C. and a pressure ranging from bout 0.1 Torr to from about 1 Torr for about 3 to 10 minutes, and wherein the deposition of the nitride layer is performed with $NH_3$ gas and di-chloro-silen (DCS), wherein a ratio of $NH_3$ gas:di-chloro-silen (DCS) is 3~10:1; and forming sequentially a dielectric material and an upper electrode on the nitride layer.

2. The method as recited in claim 1, wherein the dielectric material is $Ta_2O_5$.

3. The method as recited in claim 1, wherein the $NH_3$ annealing process is carried out in a furnace.

4. The method as recited in claim 3, wherein the $NH_3$ annealing is performed at a temperature in a range from about 500° C. to about 800° C. and a pressure ranging from about 1 Torr to about 200 Torr for about 1 to 3 hours.

5. The method as recited in claim 4, wherein the $NH_3$ annealing process is carried out by supplying the $NH_3$ gas with amount set in a range from about 1 slm to about 3 slm.

6. The method as recited in claim 1, wherein the lower electrode is formed with polysilicon or a metal.

7. The method as recited in claim 1, wherein the upper electrode is formed with TiN and polysilicon or metal.

* * * * *